(12) United States Patent
Wang

(10) Patent No.: US 6,404,263 B1
(45) Date of Patent: Jun. 11, 2002

(54) MIXER HAVING COMPENSATION FOR HARMONICS OF LOCAL OSCILLATOR SIGNAL

(75) Inventor: Xiaodong Wang, Acton, MA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/903,283

(22) Filed: Jul. 11, 2001

(51) Int. Cl.$^7$ .................................................. G06G 7/44
(52) U.S. Cl. ...................................... 327/359; 330/252
(58) Field of Search .............................. 327/115, 113, 327/116, 355, 356, 357, 359, 360, 361; 330/252, 253

(56) References Cited

U.S. PATENT DOCUMENTS

| | | | |
|---|---|---|---|
| 5,329,189 A | * 7/1994 | Ushida et al. ............... | 327/105 |
| 5,379,457 A | 1/1995 | Nguyen ....................... | 455/323 |
| 5,565,809 A | 10/1996 | Shou et al. .................. | 327/356 |
| 5,587,682 A | * 12/1996 | Colli et al. .................. | 327/113 |
| 5,589,791 A | 12/1996 | Gilbert ........................ | 327/359 |
| 5,625,307 A | 4/1997 | Scheinberg ................. | 327/113 |
| 5,675,392 A | 10/1997 | Nayebi et al. ............... | 348/584 |
| 5,844,449 A | 12/1998 | Abeno et al. ................ | 332/105 |
| 5,847,623 A | 12/1998 | Hadjichristos .............. | 332/105 |
| 5,973,539 A | 10/1999 | Komurasaki et al. ........ | 327/359 |
| 6,054,889 A | 4/2000 | Kobayashi ................... | 327/357 |
| 6,073,002 A | * 6/2000 | Peterson ..................... | 327/113 |
| 6,118,339 A | 9/2000 | Gentzler et al. ............. | 330/149 |

* cited by examiner

Primary Examiner—Toan Tran
Assistant Examiner—Linh Nguyen
(74) Attorney, Agent, or Firm—Ratner & Prestia; Joseph P. Abate, Esq.

(57) ABSTRACT

A mixer for a wireless communications system having a differential amplifier that translates an input intermediate frequency voltage signal or an input radio frequency voltage signal to current signals that are supplied to a doubly-balanced switching modulator that develops a differential mixed output radio frequency signal or intermediate frequency signal that is the product of the current signals and a local oscillator signal. Included in the differential amplifier are a first reactance circuit and a second reactance circuit each of which provides a low impedance to ground at the second harmonic of the local oscillator signal and a high impedance at the frequency of the input radio frequency signal or input intermediate frequency signal.

20 Claims, 3 Drawing Sheets

MIXER HAVING COMPENSATION FOR HARMONICS OF LOCAL OSCILLATOR SIGNAL

TECHNICAL FIELD

The present invention relates, in general, to mixers used in wireless communications systems and, more specifically, to a mixer that reduces the effect of the harmonics of the local oscillator signal, particularly the second harmonic.

BACKGROUND OF THE INVENTION

A "Gilbert Mixer" is widely used in radio frequency communications systems. FIG. 1 is a circuit diagram of a conventional "Gilbert Mixer." Mixer 10 includes a mixer core 13, which includes transistors Q1, Q2, Q3, and Q4, and a radio frequency input section 15, which includes transistors Q5 and Q6.

The operation of mixer 10 is as follows. In the absence of any voltage difference between the base of transistor Q5 and the base of transistor Q6, the collector currents of these two transistors are essentially equal. Thus, a voltage applied to the local oscillator port 12 results in no change of output current. Should a small DC offset voltage be present at the radio frequency port 14 (e.g., due to a mismatch in the emitter areas of transistors Q5 and Q6), this will only result in a small feed through of the local oscillator signal $V_{LO}$ to the intermediate frequency output port 16 which will be blocked by a first intermediate frequency filter (not shown). Conversely, if a radio frequency signal $V_{RF}$ is applied to the radio frequency port 14, but no voltage difference is applied to the local oscillator port 12, the output currents will again be balanced. A small offset voltage (due now to emitter mismatch in transistors Q1, Q2, Q3, and Q4) may cause some radio frequency signal feed through to the intermediate frequency port 16. As before, this will be rejected by the intermediate frequency filter. Thus, it is only when a signal supplied to both the local oscillator port 12 and the radio frequency port 14 that a signal appears at the intermediate frequency port 16. To reduce the gain and increase the input linearity of the mixer 10, a capacitor 18 and a resistor 20 are connected between the base and the collector of transistor Q5 and a capacitor 22 and a resistor 24 are connected between the base and the collector of transistor Q6.

Of concern with such a mixer is the possibility of high second harmonic contents in the emitters of the quad transistors Q1, Q2, Q3, and Q4 when the input level of the local oscillator signal is high. The presence of the second harmonic, which is of most concern because it has the greatest effect due to its magnitude when compared to the other harmonics, can degrade the conversion gain and linearity of the mixer.

SUMMARY OF THE INVENTION

One object of the present invention is to provide a new and improved mixer for a wireless communications system.

Another object of the present invention is to provide a new and improved mixer for a wireless communications system that compensates for harmonics of the local oscillator signal, particularly the second harmonic.

A further object of the present invention is to provide a mixer for a wireless communications system that is relatively simple in construction and inexpensive to manufacture.

Accordingly, a mixer, constructed in accordance with the present invention, includes means for supplying a first input signal and means for supplying a second input signal. This mixer also includes an input section circuit responsive to the first input signal for translating the first input signal from a voltage signal to first and second current signals. The input section circuit includes (a) first and second transducers connected in a differential configuration and each having an output for supplying one of the first and second current signals, (b) a first reactance circuit connected between a first of the transducer outputs and ground, and (c) a second reactance circuit connected between a second of the transducer outputs and ground. A mixer, constructed in accordance with the present invention, further includes a mixer core circuit responsive to the first and second current signals and the second input signal for developing a differential mixed output signal that is the product of the current signals and the second input signal.

It is to be understood that the foregoing general description of the present invention and the following detailed description of the present invention are exemplary, but are not restrictive of the invention.

DETAILED DESCRIPTION OF THE INVENTION

Figure 2:
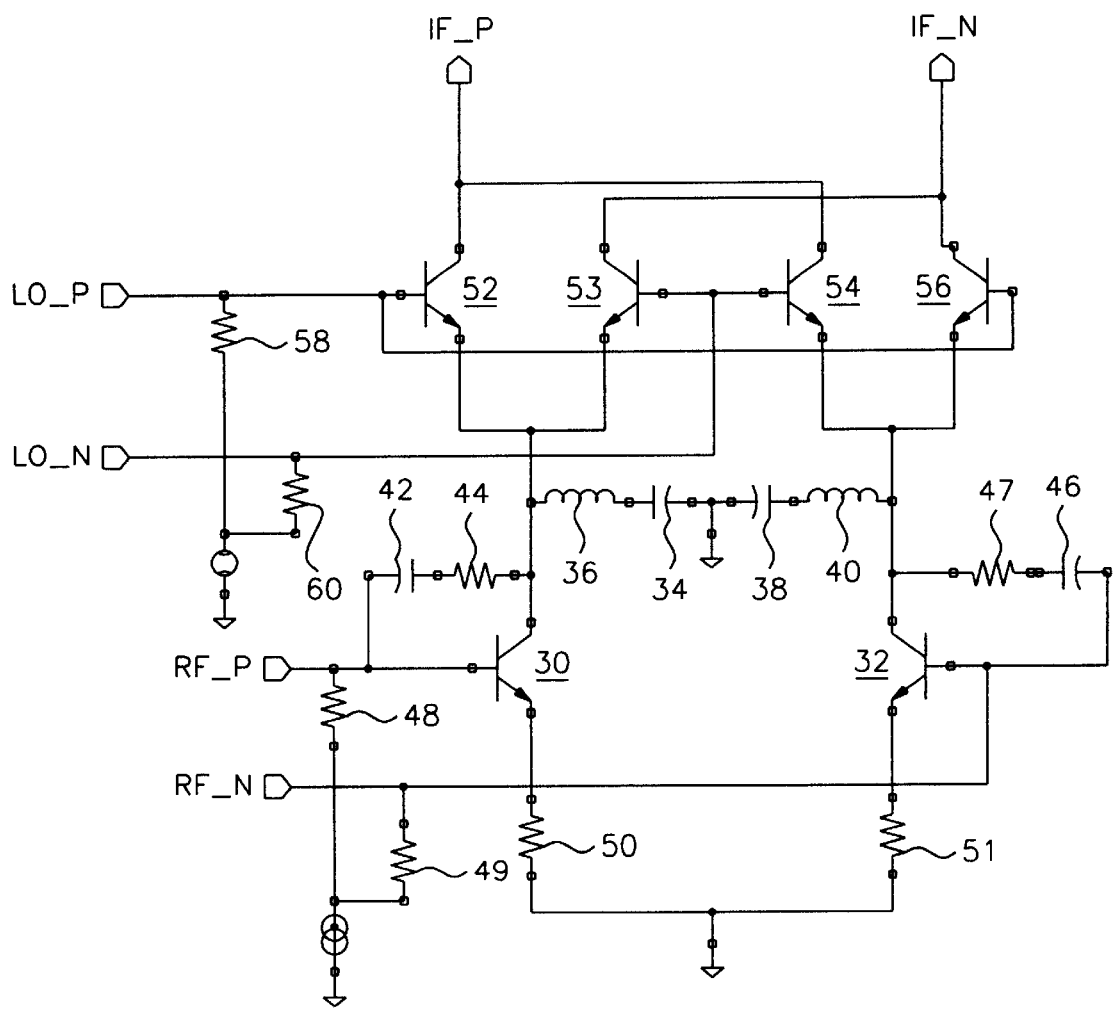
FIG. 2 is a circuit diagram of a first embodiment of a mixer constructed in accordance with the present invention.

Referring to FIG. 2, a mixer for a wireless communications system, constructed in accordance with the present invention, includes means for supplying a first input signal. Such means include a pair of terminals identified as RF P and RF N. The first input signal can be an intermediate frequency signal or a radio frequency signal. When a mixer, constructed in accordance with the present invention, is included in the receiver branch of a transmitter/receiver unit, the first input signal is a radio frequency signal. When a mixer, constructed in accordance with the present invention, is included in the transmitter branch of a transmitter/receiver unit, the first input signal is an intermediate frequency signal.

A mixer for a wireless communications system, constructed in accordance with the present invention, also includes means for supplying a second input signal. Such means include a pair of terminals identified as LO P and LO N. The second input signal is a local oscillator signal when a mixer, constructed in accordance with the present invention, is included in either the transmitter branch of a transmitter/receiver unit or in the receiver branch of a transmitter/receiver unit.

Also included in the FIG. 2 mixer is an input section circuit responsive to the first input signal for translating the first input signal (i.e., an intermediate frequency signal or a radio frequency signal) from a voltage signal to first and second current signals in the usual way. In particular, the input section circuit includes first and second transistors 30 and 32, connected as a differential amplifier, a first reactance circuit connected between the collector of first transistor 30 and ground, and a second reactance circuit connected between the collector of the second transistor 32 and ground. For the embodiment of the invention illustrated by FIG. 2, the first reactance circuit includes a first capacitor 34 connected in series with a first inductor 36 between the collector of first transistor 30 and ground and the second reactance circuit includes a second capacitor 38 connected in series with a second inductor 40 between the collector of second transistor 32 and ground.

Each of the first reactance circuit (i.e., capacitor 34 and inductor 36) and the second reactance circuit (i.e., capacitor 38 and inductor 40) provides a low impedance to ground at the second harmonic of the second input signal (i.e., a local oscillator signal) and a high impedance at the frequency of the first input signal (i.e., an intermediate frequency signal or a radio frequency signal). In this way, second harmonics of the local oscillator signal are eliminated or, at least, greatly reduced, while an intermediate frequency input signal or a radio frequency input signal is not affected to any meaningful extent.

While other harmonics of the local oscillator signal are present, they have a considerably lesser effect on the operation of the mixer because the magnitudes of these other harmonics are considerably less than the magnitude of the second harmonic. The problems that are caused by the second harmonic of the local oscillator signal can have a considerably greater effect and are addressed, in particular, by the present invention, although the first reactance circuit and the second reactance circuit attenuate the effect of the other harmonics.

Figure 1:
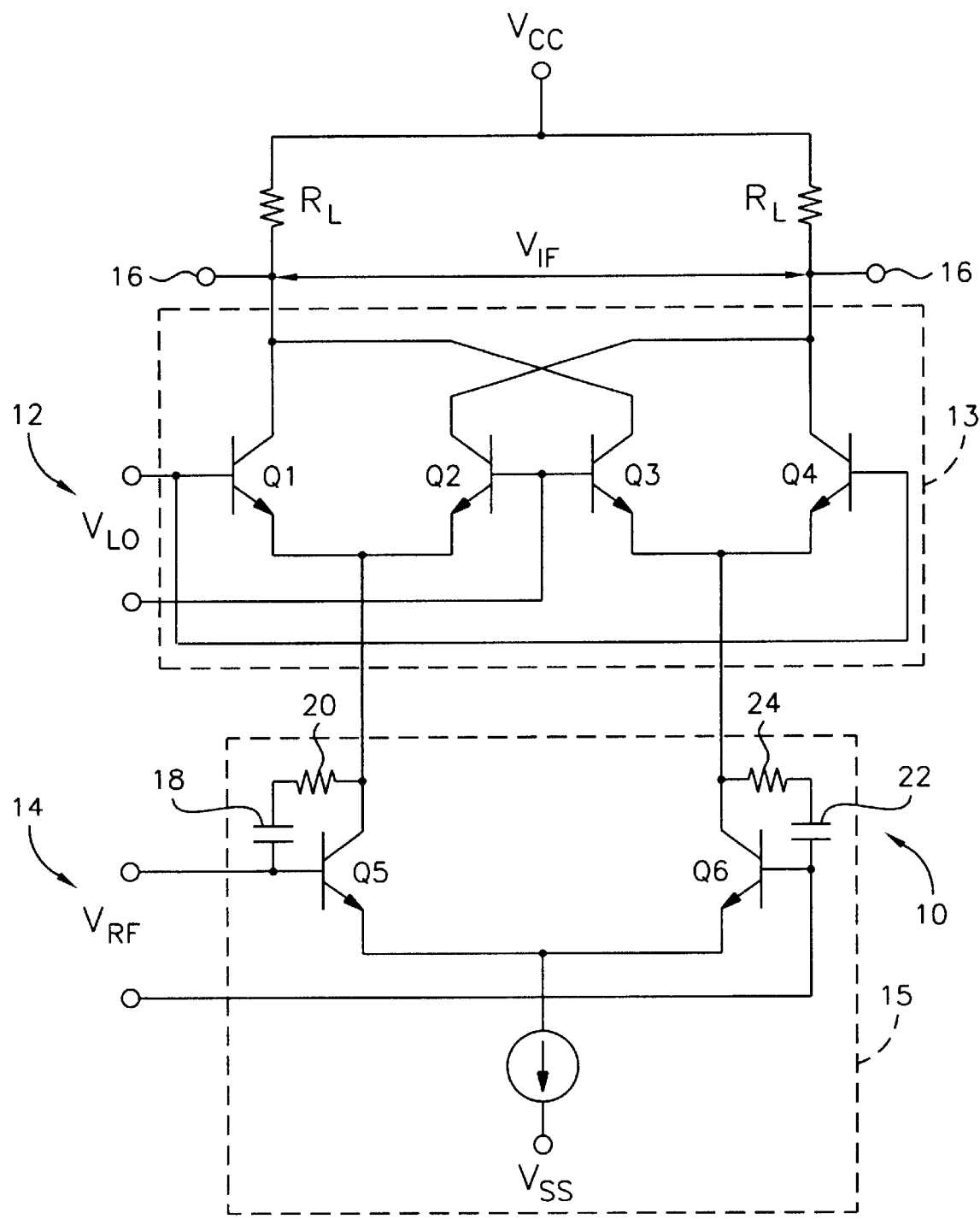
FIG. 1 is a circuit diagram of a conventional "Gilbert Mixer."

For the embodiment of the invention illustrated by FIG. 2, the input section circuit also includes a capacitor 42 and a resistor 44 that are connected between the base and the collector of transistor 30 and a capacitor 46 and a resistor 47 that are connected between the base and the collector of transistor 32. As indicated above in connection with an explanation of FIG. 1, these feedback connections reduce the gain and increase the input linearity of the mixer.

For the embodiment of the invention illustrated by FIG. 2, the input section circuit also includes resistors 48 and 49 that are biasing resistors for transistors 30 and 32, respectively. In addition, the FIG. 2 input section circuit includes resistors 50 and 51 that are connected to the emitters of transistors 30 and 32, respectively. Resistors 50 and 51 are degeneration resistors that serve to reduce the gain and improve the input linearity of the differential amplifier of the input section circuit.

A mixer, constructed in accordance with the present invention, further includes a mixer core circuit responsive to the second input signal and the current signals developed by the input section circuit. This mixer core circuit includes a third transistor 52, a fourth transistor 53, a fifth transistor 54, and a sixth transistor 56 connected as a doubly-balanced switching modulator for developing a differential mixed output signal that is the product of the current signals and the second input signal. In particular, the first current signal from transistor 30 and its associated circuitry in the input section circuit is switched between transistors 52 and 53 in the mixer core circuit and the second current signal from transistor 32 and its associated circuitry in the input section circuit is switched between transistors 54 and 56 in the mixer core circuit to produce at a pair of terminals identified as IF P and IF N a differential mixed intermediate frequency output signal when the mixer is included in the receiver branch of a transmitter/receiver unit (i.e., when the input signal at terminals RF P and RF N is a radio frequency signal) or a differential mixed radio frequency output signal when the mixer is included in the transmitter branch of a transmitter/receiver unit (i.e., when the input signal at terminals RF P and RF N is an intermediate frequency signal).

For the embodiment of the invention illustrated by FIG. 2, the mixer core circuit also includes resistors 58 and 60 that are biasing resistors for transistors 52 and 56 and transistors 53 and 54, respectively.

Figure 3:
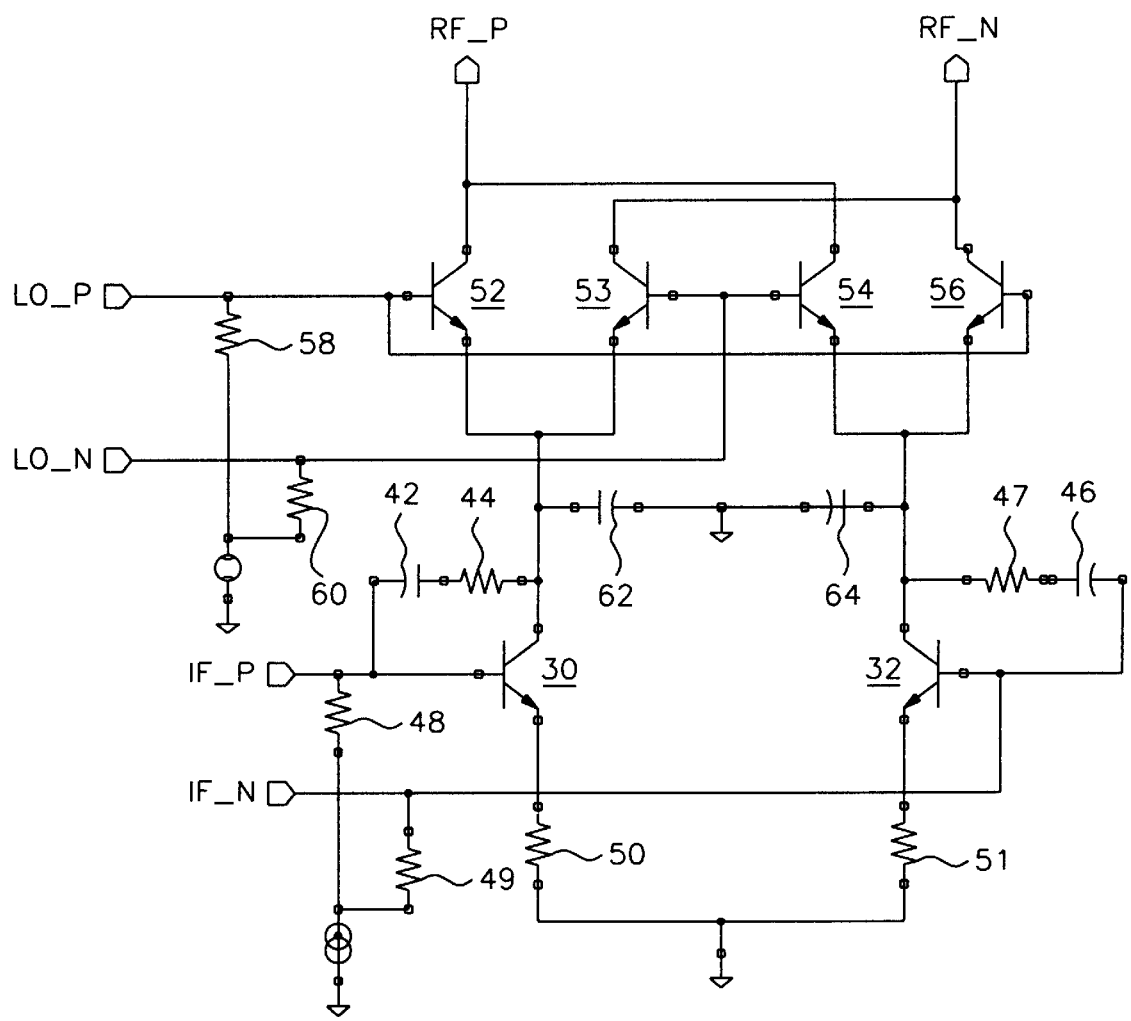
FIG. 3 is a circuit diagram of a second embodiment of a mixer constructed in accordance with the present invention.

FIG. 3 is a circuit diagram of a second embodiment of a mixer constructed in accordance with the present invention. This embodiment differs from the first embodiment illustrated by FIG. 2 only by the make up of the first and second reactance circuits of the input section circuit, the identification of the input terminals to the input section circuit as IF P and IF N instead of RF P and RF N, and the identification of the output terminals of the mixer core circuit as RF P and RF N instead of IF P and IF N.

While in the FIG. 2 embodiment of the present invention the first reactance circuit includes a first capacitor 34 connected in series with a first inductor 36 between the collector of first transistor 30 and ground and the second reactance circuit includes a second capacitor 38 connected in series with a second inductor 40 between the collector of second transistor 32 and ground, in the FIG. 3 embodiment of the present invention only a capacitor 62 is included in the first reactance circuit and only a capacitor 64 is included in the second reactance circuit. As with the FIG. 2 embodiment of the present invention, in the FIG. 3 embodiment, each of the first reactance circuit (i.e., capacitor 62) and the second reactance circuit (i.e., capacitor 64) provides a low impedance to ground at the second harmonic of the second input signal (i.e., a local oscillator signal) and a high impedance at the frequency of the first input signal (i.e., an intermediate frequency signal). In this way, second harmonics of the local oscillator signal are eliminated or, at least, greatly reduced, while an intermediate frequency input signal is not affected to any meaningful extent.

As with the FIG. 2 embodiment of the present invention, the first current signal from transistor 30 and its associated circuitry in the input section circuit is switched between transistors 52 and 53 in the mixer core circuit and the second current signal from transistor 32 and its associated circuitry in the input section circuit is switched between transistors 54 and 56 in the mixer core circuit to produce at a pair of terminals identified as RF P and RF N a differential mixed radio frequency output signal when the mixer is included in the transmitter branch of a transmitter/receiver unit. It should be noted that the FIG. 2 embodiment of the present invention is more suited for inclusion in either the transmitter branch of a transmitter/receiver unit or the receiver branch of a transmitter/receiver unit than is the FIG. 3 embodiment which is not well suited for inclusion in the receiver branch of a transmitter/receiver unit.

It should also be noted that transistors 30 and 32, included the input section circuit, serve as transducers that translate the first input signal (i.e., a radio frequency signal or an intermediate frequency signal) from a voltage signal to first and second current signals. Other components, besides transistors, can be used to perform this function. For example, FET's with the reactance circuits connected between the drains of the FET's and ground can serve as the transducers that translate the first input signal from a voltage signal to first and second current signals.

Although illustrated and described above with reference to certain specific embodiments, the present invention nevertheless is not intended to be limited to the details shown. Rather, various modifications may be made in the details within the scope and range of equivalents of the claims and without departing from the spirit of the invention.

What is claimed:

1. A mixer comprising:

means for supplying a first input signal;

means for supplying a second input signal;

an input section circuit responsive to the first input signal and including:
(a) first and second transistors connected as a differential amplifier,
(b) a first reactance circuit connected between the collector of said first transistor and ground, and
(c) a second reactance circuit connected between the collector of said second transistor and ground for translating the first input signal from a voltage signal to first and second current signals; and a mixer core circuit responsive to the first and second current signals and the second input signal and including third, fourth, fifth and sixth transistors connected as a doubly-balanced switching modulator for developing a differential mixed output signal that is the product of the current signals and the second input signal.

2. A mixer according to claim 1 wherein each of said first reactance circuit and said second reactance circuit provides a low impedance to ground at the second harmonic of the second input signal and a high impedance at the frequency of the first input signal.

3. A mixer according to claim 2 wherein:
(a) said first reactance circuit includes a first capacitor connected in series with a first inductor between said collector of said first transistor and ground, and
(b) said second reactance circuit includes a second capacitor connected in series with a second inductor between said collector of said second transistor and ground.

4. A mixer according to claim 2 wherein:
(a) said first reactance circuit includes a first capacitor connected between said collector of said first transistor and ground, and
(b) said second reactance circuit includes a second capacitor connected between said collector of said second transistor and ground.

5. A mixer comprising:

means for supplying a radio frequency signal;

means for supplying a local oscillator signal;

an input section circuit responsive to the radio frequency signal and including:
(a) first and second transistors connected as a differential amplifier,
(b) a first reactance circuit connected between the collector of said first transistor and ground, and
(c) a second reactance circuit connected between the collector of said second transistor and ground for translating the radio frequency signal from a voltage signal to first and second current signals; and a mixer core circuit responsive to the first and second current signals and the local oscillator signal and including third, fourth, fifth and sixth transistors connected as a doubly-balanced switching modulator for developing an intermediate frequency output signal that is the product of the current signals and the local oscillator signal.

6. A mixer according to claim 5 wherein each of said first reactance circuit and said second reactance circuit provides a low impedance to ground at the second harmonic of the local oscillator signal and a high impedance at the frequency of the radio frequency signal.

7. A mixer according to claim 6 wherein:
(a) said first reactance circuit includes a first capacitor connected in series with a first inductor between said collector of said first transistor and ground, and
(b) said second reactance circuit includes a second capacitor connected in series with a second inductor between said collector of said second transistor and ground.

8. A mixer comprising:

means for supplying an intermediate frequency signal;

means for supplying a local oscillator signal;

an input section circuit responsive to the intermediate frequency signal and including:
(a) first and second transistors connected as a differential amplifier,
(b) a first reactance circuit connected between the collector of said first transistor and ground, and
(c) a second reactance circuit connected between the collector of said second transistor and ground for translating the intermediate frequency signal from a voltage signal to first and second current signals; and a mixer core circuit responsive to the current signals and the local oscillator signal and including third, fourth, fifth and sixth transistors connected as a doubly-balanced switching modulator for developing a radio frequency output signal that is the product of the current signals and the local oscillator signal.

9. A mixer according to claim 8 wherein each of said first reactance circuit and said second reactance circuit provides a low impedance to ground at the second harmonic of the local oscillator signal and a high impedance at the frequency of the intermediate frequency signal.

10. A mixer according to claim 9 wherein:
(a) said first reactance circuit includes a first capacitor connected between said collector of said first transistor and ground, and
(b) said second reactance circuit includes a second capacitor connected between said collector of said second transistor and ground.

11. A mixer according to claim 9 wherein:
(a) said first reactance circuit includes a first capacitor connected in series with a first inductor between said collector of said first transistor and ground, and
(b) said second reactance circuit includes a second capacitor connected in series with a second inductor between said collector of said second transistor and ground.

12. A mixer comprising:

means for supplying a first input signal;

means for supplying a second input signal;

an input section circuit responsive to the first input signal for translating the first input signal from a voltage signal to first and second current signals, said input section circuit including:
(a) first and second transducers connected in a differential configuration and each having an output for supplying one of the first and second current signals,
(b) a first reactance circuit connected between a first of said outputs and ground, and
(c) a second reactance circuit connected between a second of said outputs and ground; and a mixer core circuit responsive to the first and second current signals and the second input signal and including four transistors connected as a doubly-balanced switching modulator for developing a differential mixed output signal that is the product of the current signals and the second input signal.

13. A mixer according to claim 12 wherein:
(a) said first of said outputs is connected to the emitters of a first pair of said transistors, and
(b) said second of said outputs is connected to the emitters of a second pair of said transistors.

14. A mixer according to claim 12 wherein:
(a) the input signal is a radio frequency signal, and
(b) the differential mixed output signal is an intermediate frequency signal.

15. A mixer according to claim 12 wherein:
(a) the input signal is an intermediate frequency signal, and
(b) the differential mixed output signal is a radio frequency signal.

16. A mixer according to claim 12 wherein:
(a) said first reactance circuit includes a first capacitor connected in series with a first inductor between said first of said outputs and ground, and
(b) said second reactance circuit includes a second capacitor connected in series with a second inductor between said second of said outputs and ground.

17. A mixer according to claim 12 wherein:
(a) said first reactance circuit includes a first capacitor connected between said first of said outputs and ground, and
(b) said second reactance circuit includes a second capacitor connected between said second of said outputs and ground.

18. A mixer comprising:
means for supplying a first input signal;
means for supplying a second input signal;
an input section circuit responsive to the first input signal for translating the first input signal from a voltage signal to first and second current signals, said input section circuit including:
  (a) first and second transducers connected in a differential configuration and each having an output for supplying one of the first and second current signals,
  (b) a first reactance circuit connected between a first of said outputs and ground, and
  (c) a second reactance circuit connected between a second of said outputs and ground; and
a mixer core circuit responsive to the first and second current signals and the second input signal for developing a differential mixed output signal that is the product of the current signals and the second input signal.

19. A mixer according to claim 18 wherein:
(a) said first reactance circuit includes a first capacitor connected in series with a first inductor between said first of said outputs and ground, and
(b) said second reactance circuit includes a second capacitor connected in series with a second inductor between said second of said outputs and ground.

20. A mixer according to claim 18 wherein:
(a) said first reactance circuit includes a first capacitor connected between said first of said outputs and ground, and
(b) said second reactance circuit includes a second capacitor connected between said second of said outputs and ground.

\* \* \* \* \*